United States Patent
Rosen et al.

(10) Patent No.: US 7,808,271 B2
(45) Date of Patent: *Oct. 5, 2010

(54) TIME-BALANCED MULTIPLEXER SWITCHING METHODS AND APPARATUS

(75) Inventors: Eitan Rosen, Abirim (IL); Dan Lieberman, Givatayim (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 0 days.

This patent is subject to a terminal disclaimer.

(21) Appl. No.: 12/405,610

(22) Filed: Mar. 17, 2009

(65) Prior Publication Data

US 2009/0179686 A1 Jul. 16, 2009

Related U.S. Application Data

(63) Continuation of application No. 11/093,080, filed on Mar. 28, 2005, now Pat. No. 7,525,341.

(60) Provisional application No. 60/611,820, filed on Sep. 20, 2004.

(51) Int. Cl.
*G06F 7/38* (2006.01)
*H03K 19/173* (2006.01)

(52) U.S. Cl. ......................... 326/38; 326/95; 327/225; 327/407

(58) Field of Classification Search ................. None
See application file for complete search history.

(56) References Cited

U.S. PATENT DOCUMENTS

| | | | |
|---|---|---|---|
| 5,811,992 A | 9/1998 | D'Souza | |
| 6,087,886 A | 7/2000 | Ko | |
| 6,255,883 B1 | 7/2001 | Delvaux et al. | |
| 6,489,825 B1 * | 12/2002 | Pasqualini | 327/211 |
| 6,674,772 B1 | 1/2004 | Dally et al. | |
| 6,690,309 B1 | 2/2004 | James et al. | |
| 6,960,937 B1 | 11/2005 | Nguyen | |
| 6,995,584 B1 * | 2/2006 | Nguyen et al. | 326/58 |
| 7,126,404 B1 | 10/2006 | Rosen | |
| 7,202,698 B1 | 4/2007 | Bauer et al. | |
| 7,525,341 B1 * | 4/2009 | Rosen et al. | 326/38 |
| 7,652,516 B2 * | 1/2010 | Bourstein et al. | 327/291 |
| 2004/0196081 A1 | 10/2004 | Srinivasan et al. | |
| 2004/0240274 A1 | 12/2004 | Ku | |

* cited by examiner

*Primary Examiner*—Vibol Tan
*Assistant Examiner*—Dylan White

(57) ABSTRACT

Methods and apparatus are provided for time-balanced switching of multiplexer circuits. An embodiment of the invention includes a transistor chain coupled to the output of the multiplexer circuit. The transistor chain preferably delays transitions that would otherwise occur relatively quickly, to match the timing of transitions that occur relatively slowly. The timing of relatively slow transitions is left unaltered. The invention advantageously allows all selector input transitions to yield a data output transition with a substantially constant delay.

20 Claims, 7 Drawing Sheets

TIME-BALANCED MULTIPLEXER SWITCHING METHODS AND APPARATUS

This is a continuation of copending, commonly-assigned U.S. patent application Ser. No. 11/093,080, filed Mar. 28, 2005, which claims the benefit of U.S. Provisional Patent Application No. 60/611,820, filed Sep. 20, 2004, both of which are hereby incorporated by reference herein in their entireties.

BACKGROUND OF THE INVENTION

This application relates to multiplexer circuits. More particularly, this application relates to time-balanced switching of multiplexer circuits.

Multiplexers are well-known circuits that accept N selector inputs and $2^N$ data inputs, and generate a single data output. Each binary combination of the N selector inputs will select a corresponding data input and transmit its value to the data output. In general, each data input and data output can be a bus of M bits. For simplicity of illustration, the discussion herein will focus on a multiplexer with a single selector input, two single-bit data inputs, and one single-bit data output. However, it will be understood that the concepts discussed herein could easily be generalized to accommodate N selector inputs and $2^N$ data inputs, where each data input and data output can include a bus of M bits.

A common problem of multiplexer circuits is that they often exhibit unbalanced switching times. That is, certain selector input transitions may result in faster output transitions than other selector input transitions. Such unbalanced switching times may result in clock signals with uneven duty cycles, cause significant problems in double data rate ("DDR") data transmission, or otherwise degrade system integrity.

In view of the foregoing, it would be desirable to provide methods and apparatus for time-balanced multiplexer switching with respect to selector input transitions. Furthermore, it would be desirable to achieve such time-balanced switching with minimal changes to existing multiplexer implementations.

SUMMARY OF THE INVENTION

In accordance with this invention, circuitry and methods are provided for delaying relatively fast multiplexer transitions to match the timing of relatively slow multiplexer transitions. The invention preferably includes a chain of transistors coupled to an output of the multiplexer circuit. In one embodiment of the invention, the chain of transistors includes a double-inverter structure with two pull-up transistors and two pull-down transistors.

During a transition that would typically be relatively fast, the chain of transistors preferably delays the switching of the multiplexer output signal to match the timing of a relatively slow transition. On the other hand, during a transition that would typically be relatively slow, the chain of transistors preferably preserves the timing of the multiplexer output signal switching. As a result, all selector input transitions preferably result in a substantially equal delay before the corresponding output signal transitions.

The invention therefore advantageously allows time-balanced multiplexer switching with respect to selector input transitions. Furthermore, this time-balanced switching is achieved with minimal changes to existing multiplexer implementations.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
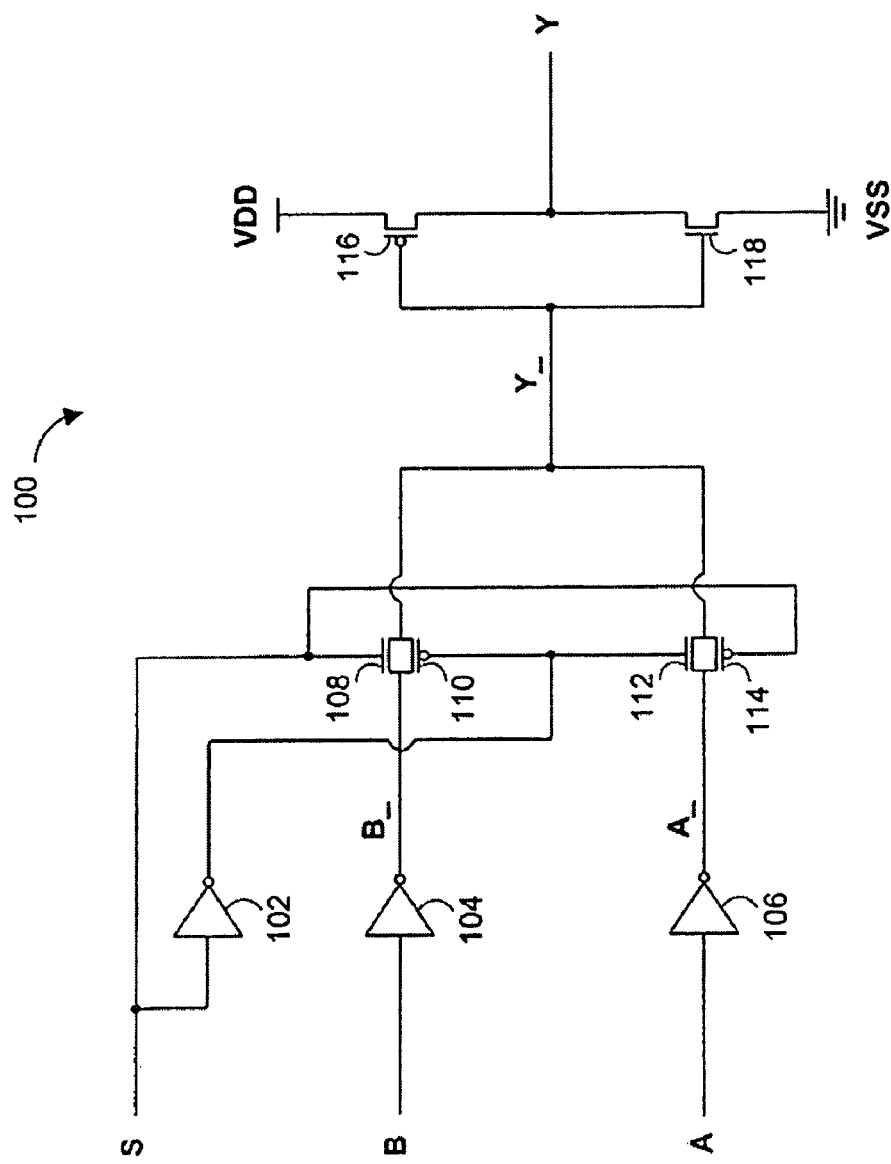
FIG. 1 is a circuit diagram of an illustrative multiplexer that exhibits unbalanced switching.

FIG. 1 is a circuit diagram of an illustrative multiplexer 100 that exhibits unbalanced switching. Selector input S selects between data inputs B and A. The selected data input is passed to data output Y through two stages of inversion. Voltage references are provided by the power source ("VDD") and ground ("VSS").

Selector input S is coupled to the gates of N-type metal-oxide semiconductor ("NMOS") transistor 108 and P-type metal-oxide semiconductor ("PMOS") transistor 114. Selector input S is also coupled to inverter 102, whose output is coupled to the gates of PMOS transistor 110 and NMOS transistor 112. Thus, transistors 108, 110, 112, and 114 serve as pass-gates that are operated by selector input S and an inversion of selector input S.

When the voltage of selector input S reflects a logical 0, transistors 112 and 114 will be activated, while transistors 108 and 110 will be deactivated. Accordingly, the logical value carried by data input A will be inverted by inverter 106 to produce signal A_, passed through transistors 112 and 114 to intermediate signal Y_, re-inverted by PMOS transistor 116 and NMOS transistor 118, and passed to data output Y.

On the other hand, when the voltage of selector input S reflects a logical 1, transistors 108 and 110 will be activated, while transistors 112 and 114 will be deactivated. Accordingly, the logical value carried by data input B will be inverted by inverter 104 to produce signal B_, passed through transistors 108 and 110 to intermediate signal Y_, re-inverted by PMOS transistor 116 and NMOS transistor 118, and passed to data output Y.

Multiplexer circuit 100 can generate transitions on data output Y in four ways. First, assume that data input A is a logical 0, while data input B is a logical 1. Then a transition on data output Y can be generated by selector input S switching from a logical 0 to a logical 1 ("low to high") or by selector input S switching in the other direction ("high to low"). Next, assume that data input A is a logical 0, while data input B is a logical 0. Again, a transition on data output Y can be generated by selector input S switching from low to high or by selector input S switching from high to low. The first pair of possible transitions of data output Y described above is relatively fast, while the second pair is relatively slow. The timing of these four possible transitions will be explored further in the following figures.

Figure 2:
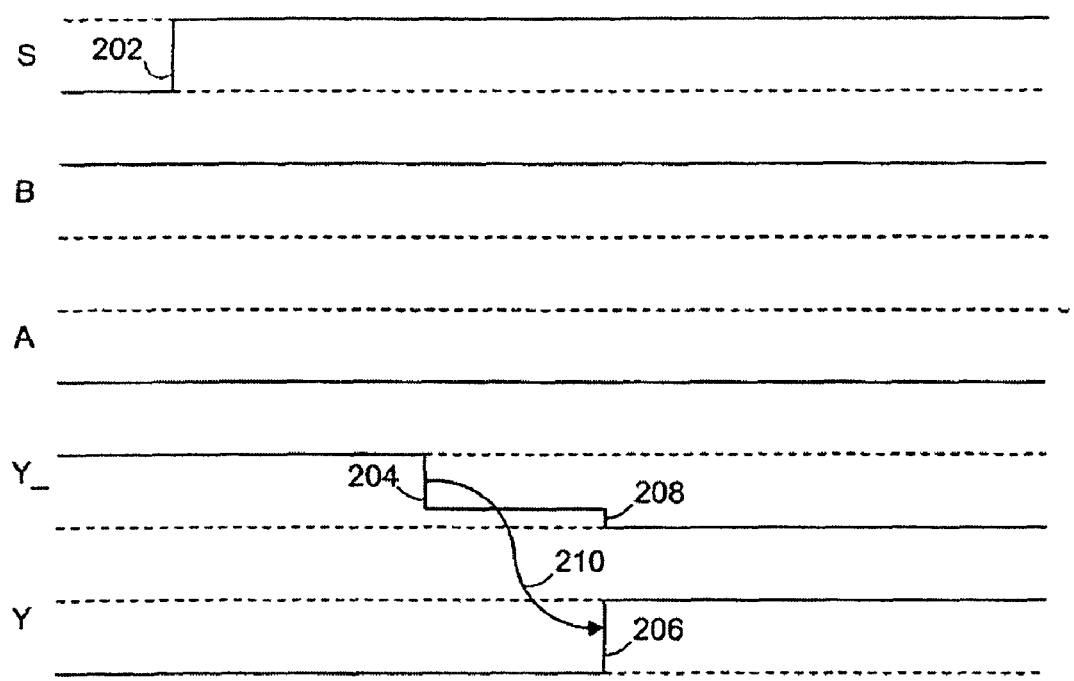
FIG. 2 is a timing diagram that illustrates a relatively fast transition of the multiplexer circuit of FIG. 1.

FIG. 2 is a timing diagram that illustrates a relatively fast transition of multiplexer circuit 100. In this scenario, data input A is a logical 0, data input B is a logical 1, and selector input S undergoes a low-to-high transition 202. With reference to FIG. 1, the state of multiplexer circuit 100 before transition 202 is as follows: transistors 112 and 114 are activated, transistors 108 and 110 are deactivated, transistor 118 is activated, and transistor 116 is deactivated.

As a result of low-to-high transition 202, transistor 108 is activated and transistor 114 is deactivated at transition 204. Because of the delay introduced by inverter 102, transistor 110 is activated and transistor 112 is deactivated substantially later, at transition 208. During the time between transitions 204 and 208, both NMOS transistor 108 and NMOS transistor 112 are activated, B_ is a logical 0, and A_ is a logical 1. Since NMOS transistors can typically pass a logical 0 more effectively than a logical 1, the logical 0 reflecting B_ will be driven onto Y_ more strongly than the logical 1 reflecting A_. Thus, Y_ takes a voltage substantially close to, but not equal to, a logical 0. This voltage change at transition 204 leads to a low to high transition 206 in data output Y, as indicated by arrow 210, due to the activation of PMOS transistor 116 and the deactivation of NMOS transistor 118. Thus, data output Y undergoes a transition as a result of the transistor switching at transition 204, and the switching at transition 208 does not lead to a substantial change on data output Y.

Figure 3:
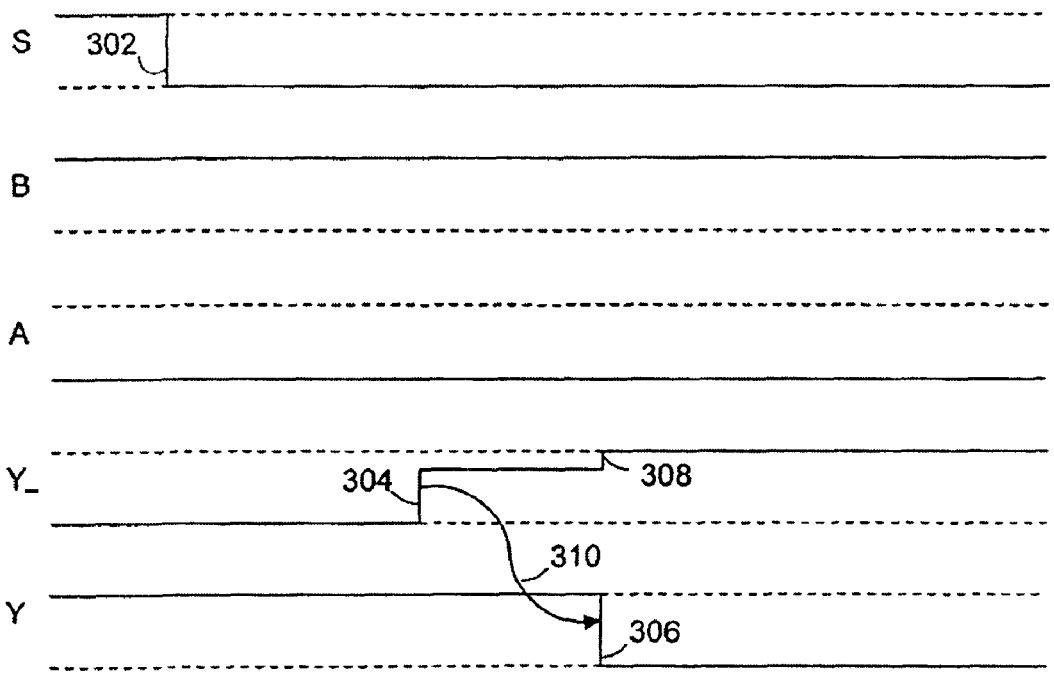
FIG. 3 is a timing diagram that illustrates another relatively fast transition of the multiplexer circuit of FIG. 1.

FIG. 3 is a timing diagram that illustrates another relatively fast transition of multiplexer circuit 100. In this scenario, data input A is again a logical 0 and data input B is again a logical 1, but selector input S undergoes a high-to-low transition 302. Because the transitions illustrated by FIG. 3 are substantially similar to those illustrated by FIG. 2, it is not deemed necessary to describe the transitions of FIG. 3 in as much detail. Reference numbers that correspond to similar elements in FIGS. 2 and 3 differ by 100.

As a result of transition 302, transistor 108 is deactivated and transistor 114 is activated at transition 304. Substantially later, at transition 308, transistor 110 is deactivated and transistor 112 is activated. Between transitions 304 and 308, both PMOS transistor 110 and PMOS transistor 114 are activated. Since PMOS transistors can typically pass a logical 1 more effectively than a logical 0, the logical 1 reflecting A_ will be driven onto Y_ more strongly than the logical 0 reflecting B_. Thus, Y_ takes a voltage substantially close to, but not equal to, a logical 1. This voltage change at transition 304 leads to a low-to-high transition 306 in data output Y, as indicated by arrow 310. Thus, data output Y undergoes a transition as a result of the transistor switching at transition 304, and the switching at transition 308 does not lead to a substantial change on data output Y.

Figure 4:
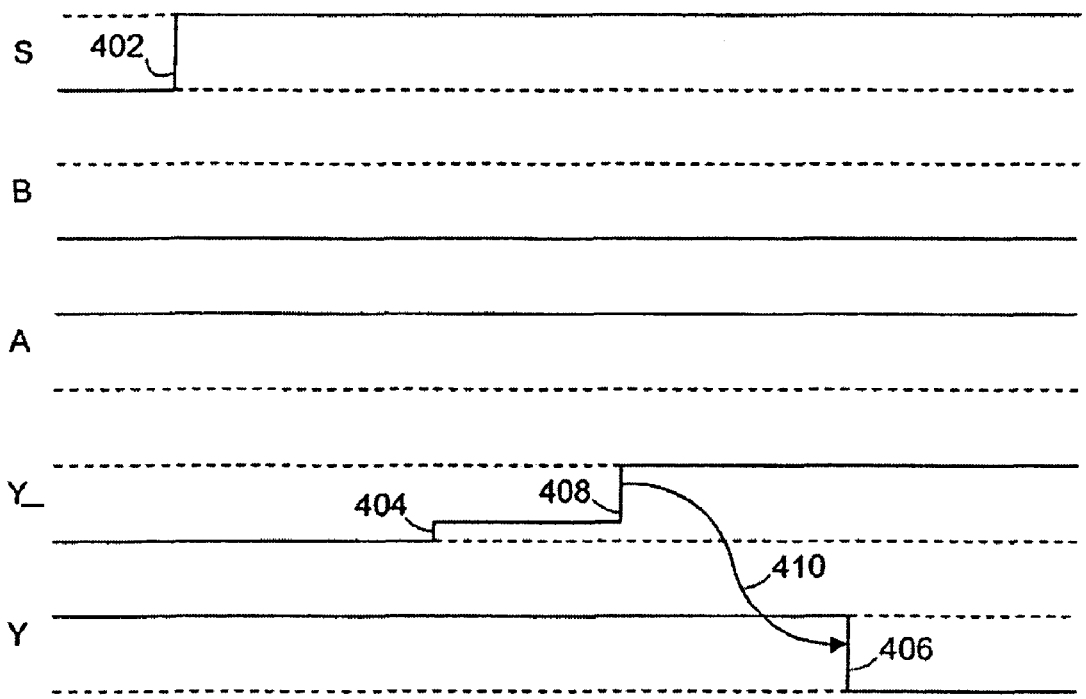
FIG. 4 is a timing diagram that illustrates a relatively slow transition of the multiplexer circuit of FIG. 1.

FIG. 4 is a timing diagram that illustrates a relatively slow transition of multiplexer circuit 100. In this scenario, data input A is a logical 1, data input B is a logical 0, and selector input S undergoes a low-to-high transition 402. With reference to FIG. 1, the state of multiplexer circuit 100 before transition 402 is as follows: transistors 112 and 114 are activated, transistors 108 and 110 are deactivated, transistor 116 is activated, and transistor 118 is deactivated.

As a result of low-to-high transition 402, transistor 108 is activated and transistor 114 is deactivated at transition 404. Because of the delay introduced by inverter 102, transistor 110 is activated and transistor 112 is deactivated substantially later, at transition 408. During the time between transitions 404 and 408, both NMOS transistor 108 and NMOS transistor 112 are activated, B_ is a logical 1, and A_ is a logical 0. Since NMOS transistors can typically pass a logical 0 more effectively than a logical 1, the logical 0 reflecting A_ will be driven onto Y_ more strongly than the logical 1 reflecting B_. Thus, Y_ takes a voltage substantially close to, but not equal to, a logical 0.

In contrast to the fast-transition scenarios illustrated in FIGS. 3 and 4, this partial voltage change at transition 404 does not lead to a corresponding transition in data output Y. Because the partial voltage change is not strong enough to reverse the logical value of Y_, transistors 116 and 118 remain activated and deactivated, respectively. Thus, data output Y does not undergo a transition until Y_ undergoes a full voltage change at transition 408, which leads to the activation of NMOS transistor 118 and the deactivation of PMOS transistor 116 at transition 406, as indicated by arrow 410. As a result, the delay between transitions 402 and 406 is substantially longer than the delay between transitions 202 and 206 (and similarly, between transitions 302 and 306).

Figure 5:
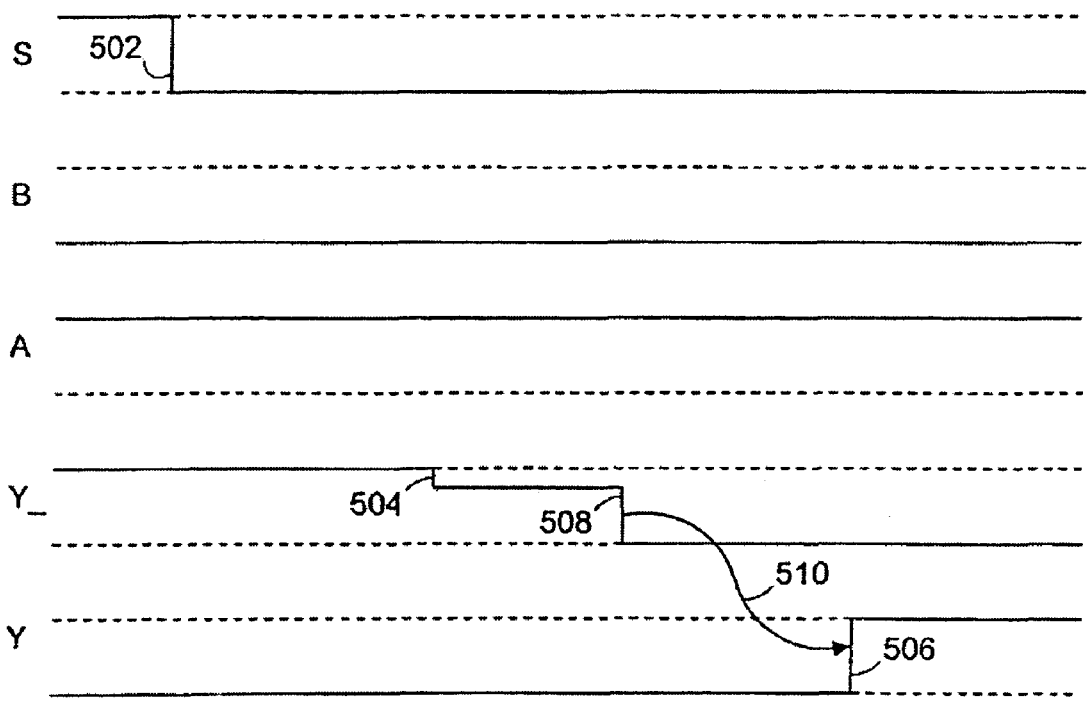
FIG. 5 is a timing diagram that illustrates another relatively slow transition of the multiplexer circuit of FIG. 1.

FIG. 5 is a timing diagram that illustrates another relatively slow transition of multiplexer circuit 100. In this scenario, data input A is again a logical 1 and data input B is again a logical 0, but selector input S undergoes a high-to-low transition 502. Because the transitions illustrated by FIG. 5 are substantially similar to those illustrated by FIG. 4, it is not deemed necessary to describe the transitions of FIG. 5 in as much detail. Reference numbers that correspond to similar elements in FIGS. 4 and 5 differ by 100.

As a result of transition 502, transistor 108 is deactivated and transistor 114 is activated at transition 504. Substantially later, at transition 508, transistor 110 is deactivated and transistor 112 is activated. Between transitions 504 and 508, both PMOS transistor 110 and PMOS transistor 114 are activated. Since PMOS transistors can typically pass a logical 1 more effectively than a logical 0, the logical 1 reflecting B_ will be driven onto Y_ more strongly than the logical 0 reflecting A_. Thus, Y_ takes a voltage substantially close to, but not equal to, a logical 0.

As in FIG. 4, this partial voltage change at transition 504 does not lead to a corresponding transition in data output Y. Thus, data output Y does not undergo transition 506 until after Y_ undergoes a full voltage change at transition 508, as indicated by arrow 510. As a result, the delay between transitions 502 and 506 is substantially longer than the delay between transitions 202 and 206 (and similarly, between transitions 302 and 306).

Figure 6:
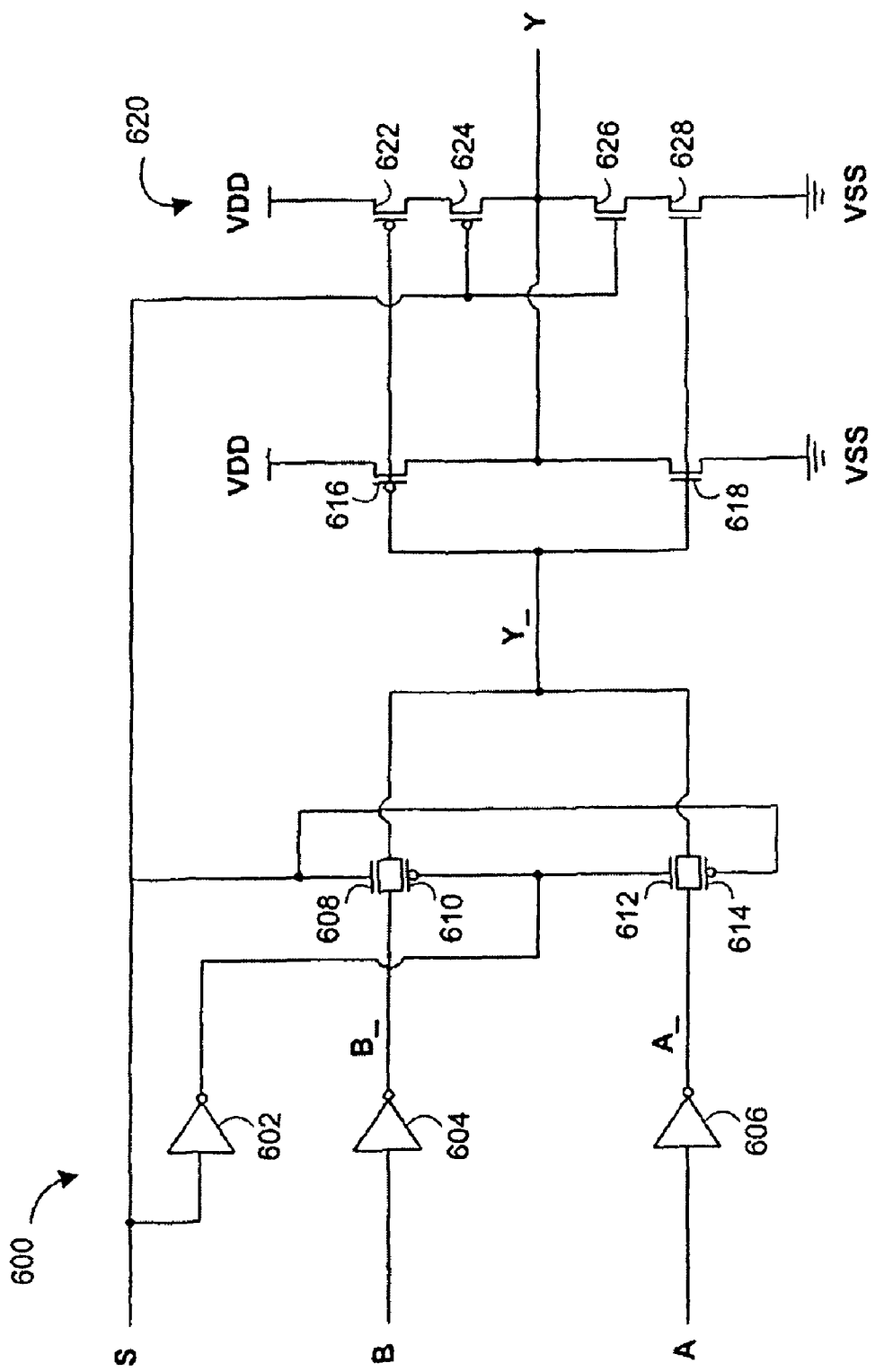
FIG. 6 is a circuit diagram of an illustrative multiplexer that exhibits balanced switching in accordance with the invention.

FIG. 6 is a circuit diagram of an illustrative multiplexer 600 that exhibits balanced switching with respect to selector input transitions in accordance with the invention. Multiplexer circuit 600 contains elements that are substantially similar to those in multiplexer circuit 100, including inverters 602, 604, and 606, NMOS transistors 608, 612, and 618, and PMOS transistors 610, 614, and 616. As was the case with multiplexer circuit 100, multiplexer circuit 600 is configured to pass the logical value of data input A to data output Y when selector input S is a logical 0. Likewise, multiplexer circuit 600 is configured to pass the logical value of data input B to data output Y when selector input S is a logical 1. Note that the values of data inputs A and B must be valid before selector input S undergoes a transition.

Multiplexer circuit 600 also includes additional transistor chain 620, which includes PMOS transistors 622 and 624, as well as NMOS transistors 626 and 628. The gates of transistors 622 and 628 are coupled to signal Y_, while the gates of transistors 624 and 626 are coupled to selector input S. Transistor chain 620 serves to delay relatively fast transitions, such as those illustrated in FIGS. 2 and 3, such that the switching of multiplexer circuit 600 is substantially time-balanced. The operation of transistor chain 620 will be described in more detail in connection with FIGS. 7-10.

Figure 7:
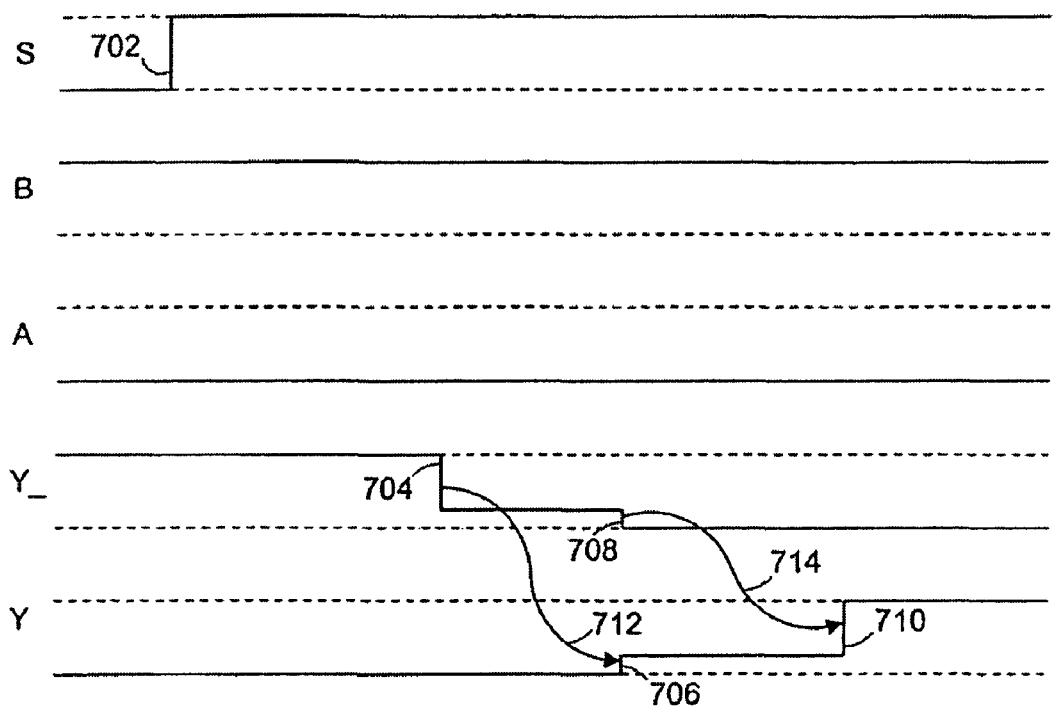
FIG. 7 is a timing diagram that illustrates the delaying of a relatively fast transition of the multiplexer circuit of FIG. 6.

FIG. 7 is a timing diagram that illustrates the delaying of a relatively fast transition of multiplexer circuit 600, and corresponds roughly to FIG. 2. In this scenario, data input A is a logical 0, data input B is a logical 1, and S undergoes a low-to-high transition 702. With reference to FIG. 6, the state of multiplexer circuit 600 before transition 702 is as follows: transistors 612 and 614 are activated, transistors 608 and 610 are deactivated, transistor 618 is activated, and transistor 616 is deactivated. In addition, the state of transistor chain 620 before transition 702 is as follows: transistors 622 and 626 are deactivated, while transistors 624 and 628 are activated. Thus, transistor chain 620 does not affect the voltage of data output Y before transition 702.

As a result of low-to-high transition 702, transistor 608 is activated and transistor 614 is deactivated at transition 704. Because of the delay introduced by inverter 602, transistor 610 is activated and transistor 612 is deactivated substantially later, at transition 708. During the time between transitions 704 and 708, both NMOS transistor 608 and NMOS transistor 612 are activated, B_ is a logical 0, and A_is a logical 1. Since NMOS transistors can typically pass a logical 0 more effectively than a logical 1, the logical 0 reflecting B_ will be driven onto Y_ more strongly than the logical 1 reflecting A . Thus, Y_ takes a voltage substantially close to, but not equal to, a logical 0.

However, because of the presence of transistor chain 620, data output Y does not undergo a full voltage transition as in FIG. 2. Instead, during the time between transitions 704 and 708, Y is driven as follows. Due to the substantially low voltage on Y_ resulting from transition 704, PMOS transistors 616 and 622 are almost completely activated, while NMOS transistors 618 and 628 are almost completely deactivated. At the same time, the relatively strong logical 1 being driven on selector input S results in the substantially complete deactivation of PMOS transistor 624 and the substantially complete activation of NMOS transistor 626.

Because PMOS transistor 624 has been completely deactivated, transistors 622 and 624 exert essentially no influence on data output Y. Partially activated transistor 616 drives Y towards a logical 1. At the same time, partially deactivated transistors 618 and 628, as well as completely activated transistor 626, drive Y towards a logical 0. Because the drive towards logical 0 is substantially stronger than the drive towards logical 1, data output Y will take a voltage close to, but not equal to, a logical 0 at transition 706. The connection between transitions 704 and 706 is shown by arrow 712.

Transition 708 occurs when PMOS transistor 610 is activated and NMOS transistor 612 is deactivated, driving the voltage of signal Y_ down to a full logical 0. As a result of this change in Y_, transistors 616 and 622 become fully activated, while transistors 618 and 628 become fully deactivated, at transition 710. The connection between transitions 708 and 710 is shown by arrow 714. Transistor 624 remains fully deactivated and transistor 626 remains fully activated. After transition 710, transistor chain 620 exerts essentially no influence on the voltage of data output Y, driving it to neither a logical 1 nor a logical 0. Thus, data output Y is simply pulled to a logical 1 by fully activated PMOS transistor 616.

The invention therefore advantageously delays the low-to-high transition of data output Y until after signal Y_ becomes a full logical 0. This delay matches that of the relatively slow transitions shown in FIGS. 4 and 5, resulting in substantially time-balanced multiplexer switching. Although there is a slight change in the voltage of data output Y at transition 706, the change is not significant enough to substantially affect circuitry using data output Y as an input. In addition, it is possible to modify the effect of transition 706 by appropriate sizing of the transistors in multiplexer circuit 600, or by any other suitable techniques.

Figure 8:
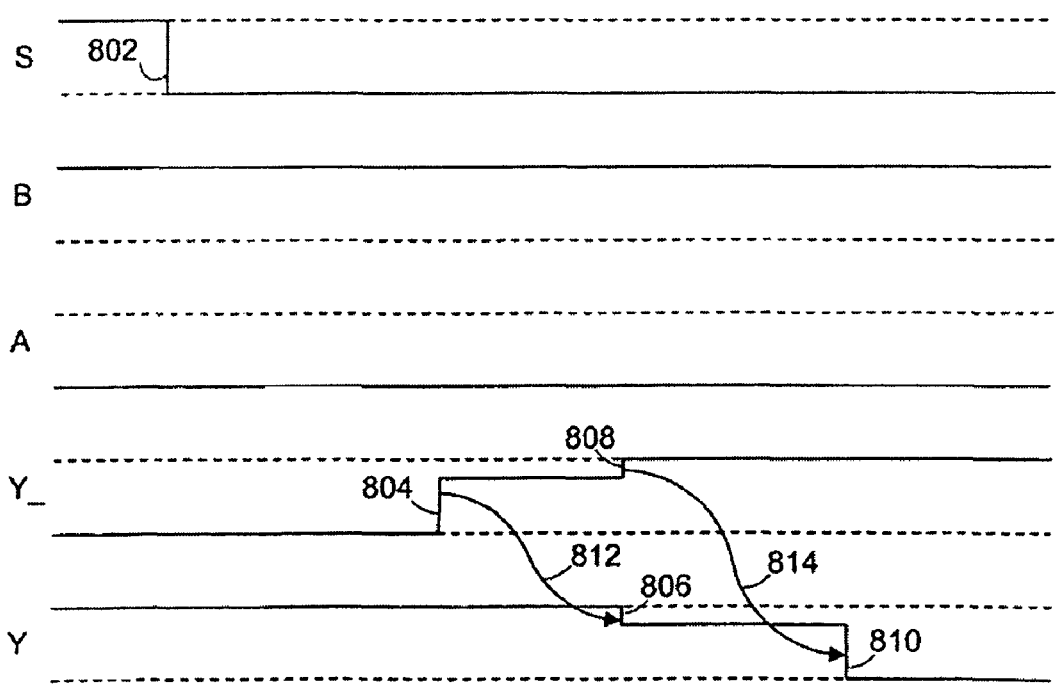
FIG. 8 is a timing diagram that illustrates the delaying of another relatively fast transition of the multiplexer circuit of FIG. 6.

FIG. 8 is a timing diagram that illustrates the delaying of another relatively fast transition of multiplexer circuit 600. In this scenario, data input A is again a logical 0 and data input B is again a logical 1, but selector input S undergoes a high-to-low transition 802. Because the transitions illustrated by FIG. 8 are substantially similar to those illustrated by FIG. 7, it is not deemed necessary to describe the transitions of FIG. 8 in as much detail. Reference numbers that correspond to similar elements in FIGS. 7 and 8 differ by 100.

As a result of transition 802, transistor 608 is deactivated and transistor 614 is activated at transition 804. Substantially later, at transition 808, transistor 610 is deactivated and transistor 612 is activated. Between transitions 804 and 808, both PMOS transistor 610 and PMOS transistor 614 are activated. Since PMOS transistors can typically pass a logical 1 more effectively than a logical 0, the logical 1 reflecting A will be driven onto Y_ more strongly than the logical 0 reflecting B_. Thus, Y_ takes a voltage substantially close to, but not equal to, a logical 1.

However, because of the presence of transistor chain 620, data output Y does not undergo a full voltage transition as in FIG. 3. Instead, as a result of transition 804, PMOS transistors 616 and 622 are partially deactivated, NMOS transistors 618 and 628 are partially activated, PMOS transistor 624 is completely activated, and NMOS transistor 626 is completely deactivated. Because NMOS transistor 626 has been completely deactivated, transistors 626 and 628 exert essentially no influence on data output Y. Partially activated transistor 618 drives Y towards a logical 0. Partially deactivated transistor 616, partially deactivated transistor 622, and completely activated transistor 624 drive Y towards a logical 1. Because the drive towards logical 1 is substantially stronger than the drive towards logical 0, data output Y will take a voltage close to, but not equal to, a logical 1 at transition 806. The connection between transitions 804 and 806 is shown by arrow 812.

Transition 808 occurs when PMOS transistor 610 is deactivated and NMOS transistor 612 is activated, driving the voltage of signal Y_ up to a full logical 1. As a result of this change in Y_, transistors 616 and 622 become fully deactivated, while transistors 618 and 628 become fully activated, at transition 810. The connection between transitions 808 and 810 is shown by arrow 814. Transistor 624 remains fully activated and transistor 626 remains fully deactivated. After transition 810, transistor chain 620 exerts essentially no influence on the voltage of data output Y, driving it to neither a logical 1 nor a logical 0. Thus, data output Y is simply pulled to a logical 0 by fully activated NMOS transistor 618. The invention therefore advantageously delays the high-to-low transition of data output Y until after signal Y_ becomes a full logical 1. This delay matches that of the relatively slow transitions shown in FIGS. 4 and 5, resulting in substantially time-balanced multiplexer switching.

Figure 9:
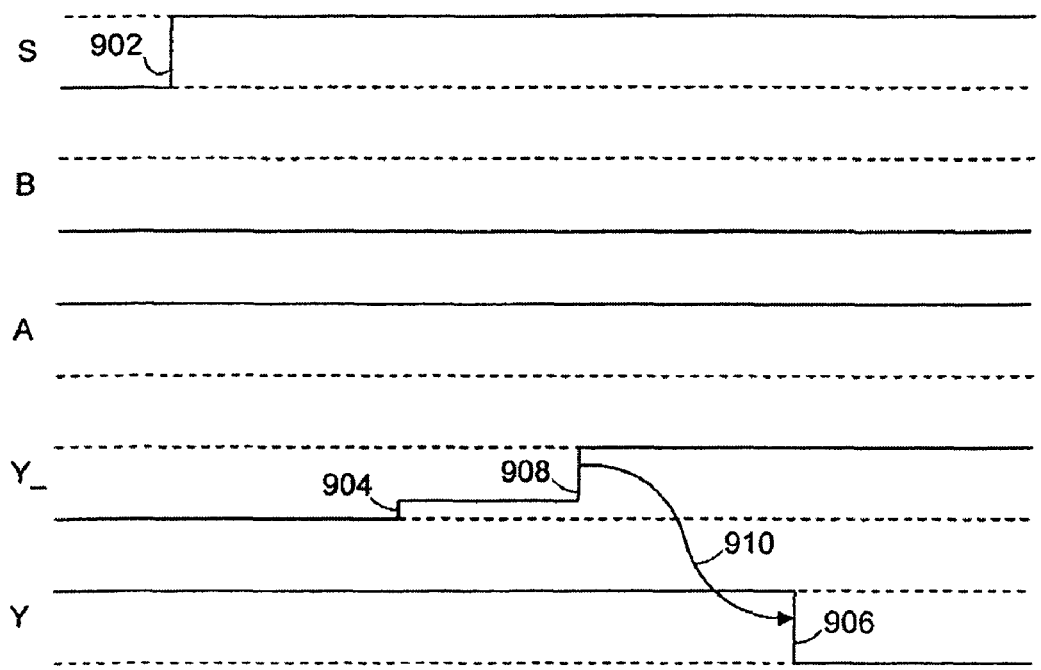
FIG. 9 is a timing diagram that illustrates a relatively slow transition of the multiplexer circuit of FIG. 6.

FIG. 9 is a timing diagram that illustrates a relatively slow transition of multiplexer circuit 600. In this scenario, data input A is a logical 1, data input B is a logical 0, and selector input S undergoes a low-to-high transition 902. With reference to FIG. 6, the state of multiplexer circuit 600 before transition 902 is as follows: transistors 612 and 614 are activated, transistors 608 and 610 are deactivated, transistor 616 is activated, and transistor 618 is deactivated. In addition, the state of transistor chain 620 before transition 902 is as follows: transistors 622 and 624 are activated, while transistors 626 and 628 are deactivated. Thus, transistor chain 620 reinforces the drive of transistor 616, pushing data output Y to a logical 1.

As a result of low-to-high transition 902, transistor 608 is activated and transistor 614 is deactivated at transition 904. Because of the delay introduced by inverter 602, transistor 610 is activated and transistor 612 is deactivated substantially later, at transition 908. During the time between transitions 904 and 908, both NMOS transistor 608 and NMOS transistor 612 are activated, B_ is a logical 1, and A_ is a logical 0. Since NMOS transistors can typically pass a logical 0 more effectively than a logical 1, the logical 0 reflecting A_ will be driven onto Y_ more strongly than the logical 1 reflecting B_. As a result, Y_ takes a voltage substantially close to, but not equal to, a logical 0 and accordingly, the states of transistors 616, 622, 618, and 628 remain substantially unchanged.

In addition, low-to-high transition 902 deactivates PMOS transistor 624 and activates NMOS transistor 626, forcing transistor chain 620 to exert essentially no drive on data output Y. Thus, data output Y does not undergo an earlier transition as a result of the addition of transistor chain 620, as it did in FIGS. 7 and 8. It is not until transition 908, when PMOS transistor 610 is activated and NMOS transistor 612 is deactivated, driving signal Y_ to a full logical 1, that signal Y can begin to substantially switch. This switching occurs at transition 906, after which point PMOS transistors 616, 622, and 624 are all deactivated, while NMOS transistors 618, 626, and 628 are all activated, driving data output Y strongly to a logical 0. The connection between transitions 908 and 906 is shown by arrow 910.

Figure 10:
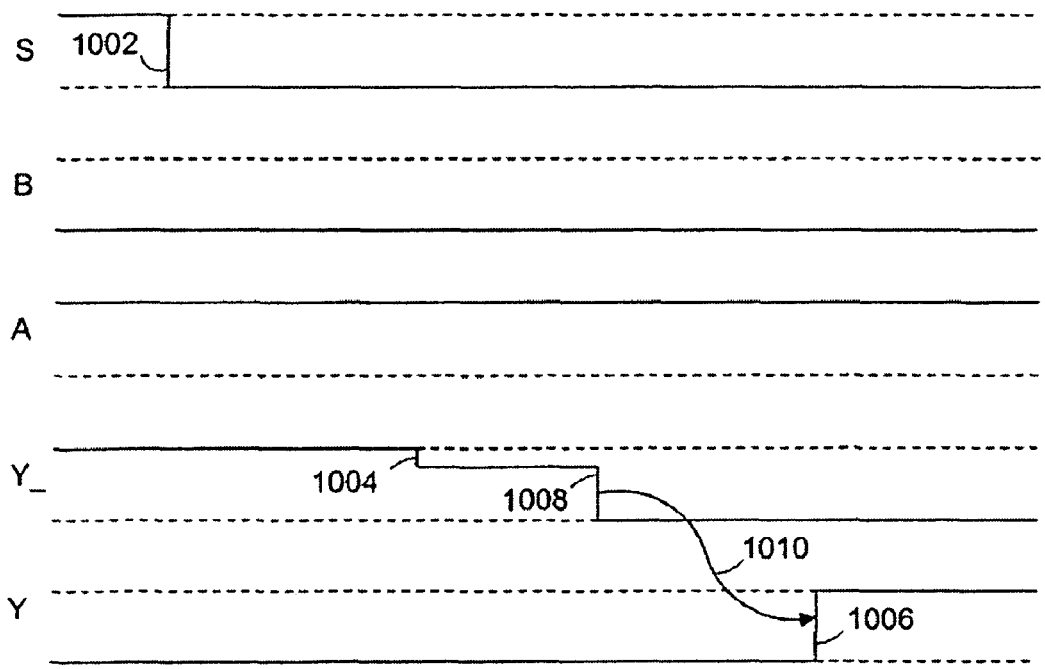
FIG. 10 is a timing diagram that illustrates another relatively slow transition of the multiplexer circuit of FIG. 6.

The invention therefore advantageously preserves the delay between transitions 902 and 906. The preservation allows the delayed timing shown in FIGS. 7 and 8 to match the unaltered timing shown in FIG. 9, providing time-balanced multiplexer switching with respect to selector input transitions. As shown in FIG. 10, the switching delay is also preserved in the case analogous to that shown in FIG. 5.

FIG. 10 is a timing diagram that illustrates another relatively slow transition of multiplexer circuit 600. In this scenario, data input A is again a logical 1 and data input B is again a logical 0, but selector input S undergoes a high-to-low transition 1002. Because the transitions illustrated by FIG. 10 are substantially similar to those illustrated by FIG. 9, it is not deemed necessary to describe the transitions of FIG. 10 in as much detail. Reference numbers that correspond to similar elements in FIGS. 9 and 10 differ by 100.

As a result of high-to-low transition 1002, transistor 608 is deactivated and transistor 614 is activated at transition 1004. Substantially later, at transition 1008, transistor 610 is deactivated and transistor 612 is activated. Between transitions 1004 and 1008, both PMOS transistor 610 and PMOS transistor 614 are activated, B_ is a logical 1, and A_ is a logical 0. Since PMOS transistors can typically pass a logical 1 more effectively than a logical 0, the logical 1 reflecting B_ will be driven onto Y_ more strongly than the logical 0 reflecting A_. As a result, Y_ takes a voltage substantially close to, but not equal to, a logical 1 and accordingly, the states of transistors 616, 622, 618, and 628 remain substantially unchanged.

In addition, high-to-low transition 1002 activates PMOS transistor 624 and deactivates NMOS transistor 626, forcing transistor chain 620 to exert essentially no drive on data output Y. Thus, data output Y does not undergo an earlier transition as a result of the addition of transistor chain 620, as it did in FIGS. 7 and 8. It is not until transition 1008, when PMOS transistor 610 is deactivated and NMOS transistor 612 is activated, driving signal Y_ to a full logical 0, that signal Y can begin to substantially switch. This switching occurs at transition 1006, after which point PMOS transistors 616, 622, and 624 are all activated, while NMOS transistors 618, 626, and 628 are all deactivated, driving data output Y strongly to a logical 1. The connection between transitions 1008 and 1006 is shown by arrow 1010. The invention therefore advantageously preserves the delay between transitions 1002 and 1006.

Thus, the invention described herein effectively achieves time-balanced multiplexer switching with respect to the selector input by delaying relatively fast transitions to match the timing of relatively slow transitions. The modification to existing circuitry is relatively simple and does not consume much additional area. In addition, the invention allows substantially time-balanced multiplexer switching across a wide range of factors such as load and process variation. If required, the accuracy of the time balancing can be further improved by post-layout adjustment of the circuit, though such fine tuning may be unnecessary in many scenarios. As described herein, the time-balanced multiplexer switching achieved by the invention advantageously provides added robustness in the generation of internal clocks, in data transmission for DDR applications, and in other suitable scenarios.

It will be noted that the embodiments described herein are merely illustrative, and other embodiments are possible. For instance, multiplexer circuits 100 and 600 merely show a common implementation of a multiplexer and one possible modification of it in accordance with the invention. Other implementations and modifications that do not depart from the scope and spirit of the invention are possible. In addition, the timing diagrams shown in FIGS. 2-5 and 7-10 are merely illustrative. The timing of the transitions illustrated therein are not to scale, and serve merely to demonstrate the advantages of the invention in simple examples. In addition, as previously noted, the invention can easily be generalized to a multiplexer circuit with N selector inputs and $2^N$ data inputs, and can accommodate data inputs and outputs of M bits each.

Figure 11:
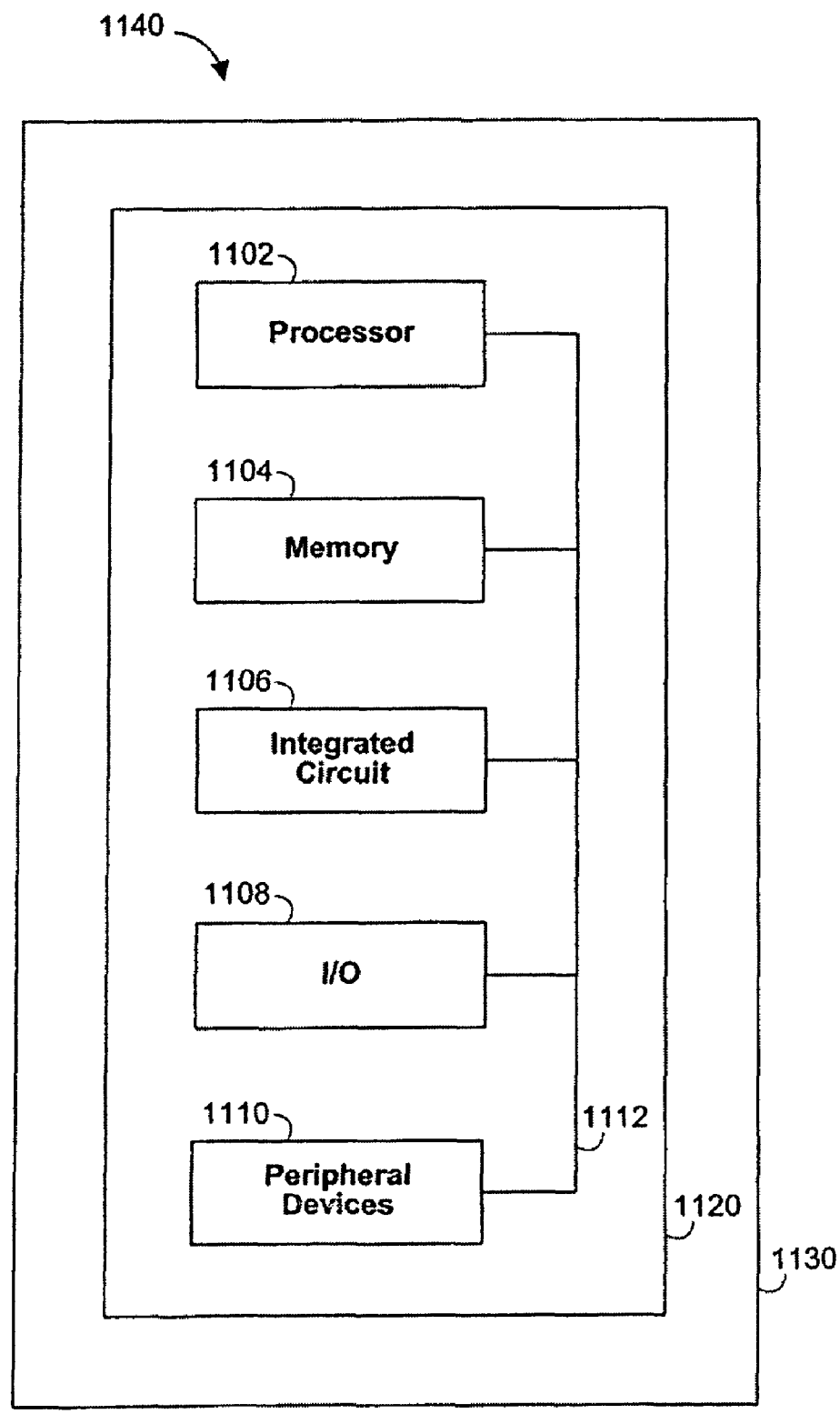
FIG. 11 is a block diagram of an illustrative system that incorporates the invention.

FIG. 11 illustrates an IC 1106, which incorporates the multiplexer circuit of this invention, in a data processing system 1140. IC 1106 may be a programmable logic device ("PLD"), an application-specific integrated circuit ("ASIC"), or a combination of the two. Data processing system 1140 may include one or more of the following components: processor 1102; memory 1104; I/O circuitry 1108; and peripheral devices 1110. These components are coupled together by a system bus 1112 and are populated on a circuit board 1120 which is contained in an end-user system 1130.

System 1140 can be used in a wide variety of applications, such as computer networking, data networking, instrumentation, video processing, or digital signal processing. IC 1106 can be used to perform a variety of different logic functions. For example, IC 1106 can be configured as a processor or controller that works in cooperation with processor 1102. IC 1106 may also be used as an arbiter for arbitrating access to a shared resource in system 1140. In yet another example, IC

1106 can be configured as an interface between processor 1102 and one of the other components in system 1140.

Thus it is seen that methods and apparatus are provided for achieving time-balanced multiplexer switching with respect to selector input transitions. One skilled in the art will appreciate that the invention can be practiced by other than the described embodiments, which are presented for purposes of illustration and not of limitation, and the present invention is limited only by the claims which follow.

We claim:

1. A switching device comprising:
    data inputs for receiving at least two input digital data signals;
    selection circuitry for outputting a selected one of said input digital data signals based on a selector signal that determines which of the input digital data signals is output by the selection circuitry; and
    a transition governor coupled to said selection circuitry and to a data output, said transition governor operable to selectively drive transitions of said data output based on said selected one of said input digital data signals and said selector signal.

2. The circuit of claim 1, wherein said transition governor is further operable to selectively drive transitions of said data output so that rising and falling transitions of said data output are time-balanced.

3. The circuit of claim 1, wherein said transition governor is operable to hold said data output substantially constant until said selection circuitry has switched from a first logical state to a second logical state in response to a transition of said selector signal.

4. The circuit of claim 1, wherein said transition governor comprises transistor circuitry.

5. The circuit of claim 4, wherein said transistor circuitry comprises a transistor chain, wherein said transistor chain comprises a plurality of transistors coupled in series.

6. The circuit of claim 5, wherein said transistor chain comprises first, second, third and fourth transistors, wherein:
    gates of said first and fourth transistors are coupled to said selected one of said input digital data signals; and
    gates of said second and third transistors are coupled to said selector signal.

7. The circuit of claim 6, further comprising:
    a source of relatively high voltage; and
    a source of relatively low voltage, wherein:
    said first and second transistors are coupled in series between said source of relatively high voltage and said data output; and
    said third and fourth transistors are coupled in series between said source of relatively low voltage and said data output.

8. The circuit of claim 1, wherein said selection circuitry comprises:
    a data node;
    first transistor circuitry coupled to a selector input, a first data input of said data inputs, and said data node, said first transistor circuitry comprising at least two transistors and being operable to pass a logical value derived from said first data input to said data node in response to a logical value derived from said selector input;
    second transistor circuitry coupled to said selector input, a second data input of said data inputs, and said data node, said second transistor circuitry comprising at least two transistors and being operable to pass a logical value derived from said first data input to said data node in response to a logical value derived from said selector input; and
    third transistor circuitry coupled to said selector input, said data node, and said data output.

9. The circuit of claim 8, wherein said selector input is operable to receive said selector signal.

10. The circuit of claim 8, wherein said third transistor circuitry comprises:
    a first transistor with a gate coupled to said data node, said fifth transistor coupled between a source of relatively high voltage and said data output; and
    a second transistor with a gate coupled to said data node, said sixth transistor coupled between a source of relatively low voltage and said data output.

11. The circuit of claim 8 further comprising an inverter coupled between said selector input and said first and second transistor circuitries.

12. The circuit of claim 11 further comprising:
    an inverter coupled between said first data input and said first transistor circuitry; and
    an inverter coupled between said second data input and said second transistor circuitry.

13. A method of switching a data output of a switching device, said method comprising:
    receiving at least two input digital data signals using respective data inputs;
    outputting, using selection circuitry, a selected one of said input digital data signals based on a selector signal that determines which of the input digital data signals is output by the selection circuitry; and
    selectively driving, using a transition governor, the transitions of a data output based on said selected one of said input digital data signals and said selector signal.

14. The method of claim 13, wherein said selectively driving comprises driving said data output so that rising and falling transitions of said data output are time-balanced.

15. The method of claim 13, wherein said selectively driving comprises holding said data output substantially constant until said selection circuitry has switched from a first logical state to a second logical state in response to a transition of said selector signal.

16. The method of claim 15, further comprising switching said data output after said selection circuitry has switched from a first logical state to a second logical state in response to a transition of said selector signal.

17. The method of claim 15, wherein said holding said data output comprises switching at least one transistor in said transition governor in response to said transition of said selector signal.

18. The method of claim 13, wherein said outputting comprises passing a first signal, derived from one of said at least two input digital data signals, through first transistor circuitry to a data node in response to a transition of said selector signal.

19. The method of claim 18, further comprising:
    disconnecting a second signal, derived from another one of said at least two input digital data signals, from said data node in response to said transition of said selector signal.

20. The method of claim 19, wherein said disconnecting comprises switching at least one transistor in a second transistor circuitry.

* * * * *